(12) United States Patent
Pawlik et al.

(10) Patent No.: US 12,060,301 B2
(45) Date of Patent: Aug. 13, 2024

(54) THERMAL MATERIAL WITH HIGH CAPACITY AND HIGH CONDUCTIVITY, METHOD FOR PREPARING SAME AND COMPONENTS COMPRISING SAME

(71) Applicants: THALES, Courbevoie (FR); UNIVERSITÉ DE LILLE, Lille (FR); NANYANG TECHNOLOGICAL UNIVERSITY, Singapore (SG); CENTRE NATIONAL DE LA RECHERCHE SCIENTIFIQUE, Paris (FR)

(72) Inventors: Matthieu Pawlik, Singapore (SG); Edwin Hang Tong Teo, Singapore (SG); Philippe Coquet, Singapore (SG)

(73) Assignees: THALES, Courbevoie (FR); UNIVERSITÉ DE LILLE, Lille (FR); NANYANG TECHNOLOGICAL UNIVERSITY, Singapore (SG); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 1088 days.

(21) Appl. No.: 16/956,132

(22) PCT Filed: Dec. 21, 2018

(86) PCT No.: PCT/EP2018/086774
§ 371 (c)(1),
(2) Date: Jun. 19, 2020

(87) PCT Pub. No.: WO2019/122419
PCT Pub. Date: Jun. 27, 2019

(65) Prior Publication Data
US 2020/0325075 A1    Oct. 15, 2020

(30) Foreign Application Priority Data

Dec. 22, 2017 (FR) ..................................... 17/01357
May 16, 2018 (WO) ................. PCT/EP2018/062780

(51) Int. Cl.
*C04B 35/583* (2006.01)
*C04B 38/00* (2006.01)
(Continued)

(52) U.S. Cl.
CPC ........ *C04B 35/583* (2013.01); *C04B 38/0003* (2013.01); *C04B 41/4535* (2013.01);
(Continued)

(58) Field of Classification Search
CPC .............................. C04B 35/583; C04B 41/83
See application file for complete search history.

(56) References Cited

U.S. PATENT DOCUMENTS

| 2011/0083826 | A1 | 4/2011 | Matta et al. |
| 2016/0146556 | A1 | 5/2016 | Chauhan et al. |
| 2019/0112445 | A1* | 4/2019 | Zhou ........................ C08K 3/08 |

FOREIGN PATENT DOCUMENTS

| CN | 105733192 A | 7/2016 |
| CN | 106497522 A | 3/2017 |

(Continued)

OTHER PUBLICATIONS

French Search Report, from the French Patent Office in counterpart French Application No. 1701357, dated Aug. 23, 2018.
(Continued)

*Primary Examiner* — Peter F Godenschwager
(74) *Attorney, Agent, or Firm* — ArentFox Schiff LLP

(57) ABSTRACT

The invention relates to a composite material based on boron nitride (BN(C)) in the form of a continuous structure; and a phase change material (PCM) incorporated within said con-
(Continued)

Figure 1:
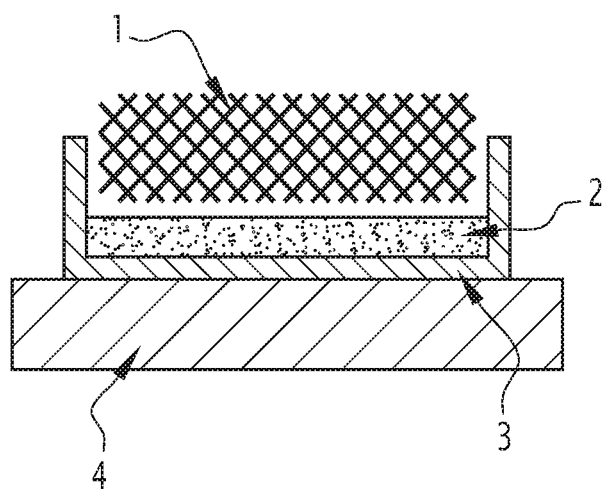

tinuous BN(C) structure and is embedded within a polymer layer, a process for manufacturing same, and the components that comprise same.

11 Claims, 18 Drawing Sheets

(51) Int. Cl.
    *C04B 41/45*     (2006.01)
    *C04B 41/53*     (2006.01)
    *C04B 41/82*     (2006.01)
    *C04B 41/85*     (2006.01)
    *F28D 20/02*     (2006.01)
    *H01L 23/427*     (2006.01)

(52) U.S. Cl.
    CPC .......... *C04B 41/5353* (2013.01); *C04B 41/82* (2013.01); *C04B 41/85* (2013.01); *H01L 23/427* (2013.01); *C04B 2237/086* (2013.01); *F28D 20/023* (2013.01)

(56) References Cited

FOREIGN PATENT DOCUMENTS

| | | |
|---|---|---|
| EP | 1 333 710 A2 | 8/2003 |
| WO | WO 2017/161993 A1 | 9/2017 |

OTHER PUBLICATIONS

International Search Report and Written Opinion, issued by International Searching Authority in corresponding International Application No. PCT/EP2018/062780, mailed on Jul. 2, 2018.

International Search Report and Written Opinion, issued by International Searching Authority in corresponding International Application No. PCT/EP2018/086774, mailed on Apr. 3, 2019.

Yang, J. et al., "An ice-templated assembly strategy to construct graphene oxide/boron nitride hybrid porous scaffolds in phase change materials with enhanced thermal conductivity and shape stability for light-thermal-electric energy conversion", Journal of Materials Chemistry A, vol. 4, No. 48, pp. 18841-18851 (2016).

Loeblein, M. et al., "A "hairy" polymer/3D-foam hybrid for flexible high performance thermal gap filling applications in harsh environments", RSC Advances, Royal Society of Chemistry, vol. 7, No. 62, pp. 39292-39298, (2017).

Loeblein, M. et al., "Configurable Three-Dimensional Boron Nitride-Carbon Architecture and Its Tunable Electronic Behavior with Stable Thermal Performances", Small, vol. 10, No. 15, pp. 2992-2999, (2014).

Liang, W. et al., "Graphene-nickel/n-carboxylic acids composites as form-stable phase change materials for thermal energy storage", Solar Energy Materials & Solar Cells, vol. 132, pp. 425-430, (2014).

\* cited by examiner

THERMAL MATERIAL WITH HIGH CAPACITY AND HIGH CONDUCTIVITY, METHOD FOR PREPARING SAME AND COMPONENTS COMPRISING SAME

CROSS-REFERENCE TO RELATED APPLICATIONS

This application is a National Stage Entry of International Patent Application No. PCT/EP2018/086774, filed on Dec. 21, 2018, and claims priority to International Patent Application No. PCT/EP2018/062780, filed on May 16, 2018, and also claims priority to French Application No. 17 01357, filed on Dec. 22, 2017. The disclosures of the priority applications are incorporated in their entirety herein by reference.

The present invention relates to thermal management, in particular for technologies which require a limitation of an increase in temperature, such as, for example, the temperature regulation of electronic components. This temperature regulation aims to effectively limit the increase in temperature of the components in the context of their use in transient operation, while occupying a minimum space with reduced weight and avoiding short-circuiting of the circuits.

The growing compactness of electronics makes the problem of thermal management increasingly crucial. The miniaturization of electronics requires heat management techniques to be compact and low-cost in energy consumption. The problem is, therefore, to find a way to limit the increase in the temperature of the components during their use, so as to ensure their optimal functioning, on the one hand, while, on the other hand, being able to efficiently store and restore the heat, in particular in confined surroundings. This needs to be effected without damaging the components, by limiting the final weight, and ensuring minimum footprint.

The most common solution for cooling is the use of a solid metal heat sink, but the latter is generally bulky and of non-negligible mass compared to that of the electronics. In addition, its ability to dissipate heat is limited.

Also, thermal interface materials are used to facilitate the removal of heat, so as to reduce any thermal contact resistance between the heat source and the heat sink. These materials are generally pastes or glues which offer excellent conformity with the components. However, these materials do not store heat.

Finally, another solution is the use of Phase Change Materials (PCM) to absorb and store heat during the period of use of the electronics. In fact, these materials have the capacity to store surrounding heat thanks to their high enthalpy of fusion (typically around 210 J/g), wherein, by absorbing the heat, they limit the increase in temperature of their surroundings. PCMs are passive components, but they have a low thermal conductivity (0.15-0.25 W/mK), while their rigidity generates a high thermal contact resistance, which limits their capacity to absorb heat.

The low thermal conductivity of PCMs may be improved by incorporating a material with high thermal conductivity.

The first studies to try to improve the thermal conductivity of PCMs were carried out in the 1980s. Since then, several strategies have been implemented to try to increase their thermal conductivity without modifying their thermal storage properties. Ji et al, *Energy Environ. Sci.*, Vol. 7, No. 3, pp. 1185-1192, 2014 reports on the various ways of improving the conductivity of PCMs.

Two strategies may be used to improve the thermal conductivity of PCMs. The addition of diffusion additives, such as carbon nanotubes, graphene sheets, or carbon fibers, offers an improvement in thermal conductivity with an increase in relation to the volume fraction of the additive of less than 2. Better continuity in conductive materials improves this increase. The first studies carried out with metallic foams confirmed this interest (aluminum, carbon, nickel). But here again, only a maximum increase of 6 was noted.

However, graphite, like metallic foams, is also an excellent electrical conductor and thus does not allow direct application to electronic components, i.e. the use of these materials on electrical components for thermal management would run the risk of short-circuiting systems.

It is, therefore, necessary to develop an alternative composite material based on PCM, and an additive offering high thermal conductivity, but which would also make it possible to modulate the electrical conductivity of the composite by making it partially electrically conductive or insulating.

Boron nitride (BN) in powder form has been proposed to improve the thermal properties of PCM. BN is an excellent electrical insulator while being an excellent thermal conductor. By mixing BN with a PCM, we may increase the thermal conductivity of the PCM, and, therefore, its thermal storage capacity, while guaranteeing electrical insulation between the components. It is also possible to dope this BN with carbon (BN(C)) which makes it more or less electrically conductive.

BN is able to compete with the thermal properties of graphene, while also offering very high electrical resistance. In its 2D form, BN is a chemically inert material, with perfect thermal stability up to 1000° C. Its thermal conductivity, although theoretically lower than graphene, remains very high (around 2000 W/mK in theory), compared to copper (400 W/mK) which is conventionally used.

Thus, Jeong et al, (*Int. J. Heat Mass Transf.*, Vol. 71, pp. 245-250, 2014) described filling PCM with BN powder of 80% of PCM, i.e. a fraction of BN of 20%. An increase in thermal conductivity of 477% compared to the thermal conductivity of the PCM is described, which therefore corresponds to an increase by volume fraction of the BN of only 0.24.

Carbon-doped BN foam (BNC) is known (Loeblein et al, Small, vol. 10, 15, 2992-2999, 2014), and has also shown its high thermal conductivity that is comparable to BN when alone.

FR 17 00516 proposes an improved composite allowing an increase in thermal conductivity, and comprising a continuous structure of BN(C) and a PCM incorporated within said structure. However, during energy storage, the PCM may change phase and flow out by fusion within the structure of BN(C). It therefore remains to produce an improved composite having similar thermal conductivity characteristics but without this drawback.

Accordingly, a composite material is proposed according to the invention and comprising:
   Boron nitride (BN(C)) in the form of a continuous structure (1);
   An internal layer of a Phase Change Material (PCM) (5) incorporated within said continuous structure of BN(C) (1), and
   A surface portion (1') of BN(C) devoid of PCM, under each of the lower and upper external faces of the composite material, of respective thickness E1 and E2,
   said material being characterized in that:
      the layer of PCM (5) is embedded by a coating layer of polymer (10) of thickness E', and said surface portions (1') devoid of PCM are each located on either side of the internal layer of embedded PCM (10).

The Embedding Polymer

According to one embodiment, said embedding polymer generally has a melting point below that of the PCM, and may be easily solidified (polymerized), for example by means of a solidifying agent (precursor), so that the polymer, once in solid form, is stable at high temperature, in particular at the phase change temperature of the PCM.

Thus, the term "polymer" as used, also relates to mixtures of said polymer and of a solidifying agent.

The polymer may be advantageously chosen so that it is in liquid form at room temperature and is thus able to infuse within the continuous structure of BN(C) without heating, wherein it is then solidified/polymerized following the desired impregnation.

Generally, the polymer is an electrical and thermal insulator.

The coating of the PCM thus makes it possible to contain the PCM within a solid polymer capsule, including during the possible phase change of the PCM to the liquid phase. The polymer capsule thus prevents leakage within the BN(C) structure of the PCM when it is in liquid form.

According to one embodiment, said polymer may be polydimethylsiloxane (PDMS) and its derivatives. Typically, PDMS may be used in liquid form at room temperature, and may be solidified/polymerized at 80° C. in the presence of a solidifying agent (precursor). PDMS is thus stable at the melting temperatures of the PCM.

In the case of PDMS, the dimethyl methyl hydrogen siloxane copolymer may be advantageously used as solidifying agent (precursor).

The coating layer consists of the embedding polymer itself impregnated within the continuous structure of BN(C): the coating layer incorporating the BN(C) and the embedding polymer, therefore, acquires the properties of BN(C) at least partially. The coating layer, therefore, has a higher thermal conductivity than that of the coating polymer. Similarly, the electrical properties of the coating layer depend on the electrical properties of BN(C) as a function of whether carbon is present or not.

The term "embedded" as used here refers to the continuous coating of the layer of PCM by the polymer, so as to contain the PCM in the said capsule thus formed, so as to avoid leaks of PCM within the structure of BN(C). The coating must therefore cover the entire volume of PCM impregnated in the structure of BN(C).

The coating layer refers to the layer of solidified polymer around the layer of PCM, and impregnated within the continuous structure of BN(C).

According to one embodiment, the coating layer has a constant thickness E' over the entire volume of PCM thus coated.

According to another embodiment, the coating layer has thicknesses Ei' identical or different on each of the faces i of the layer of PCM.

The Continuous Structure of BN(C)

The "continuous structure of BN(C)" refers to any porous material made of BN with a continuous 3D structure, not dispersed, possibly carbon (i.e.) doped with carbon: it is here classified as BNC. As a continuous structure, mention may be made, in particular, of foams and grids.

BN(C) foams and their manufacturing process are described by Loeblein et al, Small, vol. 10, 15, 2992-2999, 2014.

The BN(C) foam may typically be produced by CVD growth on a metallic skeleton of copper or nickel. After the growth of BN(C), the foam is coated with a polymer such as PMMA to ensure its stability, then it is immersed in an acid bath to remove the metal skeleton. BN foam alone is obtained by etching the polymer.

BN(C) foam may be reinforced, for example, by performing a long growth, or several growths to increase the thickness of BN(C), or by keeping PMMA on the foam (with a sufficiently thin thickness of PMMA to maintain the desired thermal conductivity, wherein the PMMA has a low thermal conductivity (0.2 W/mK), and/or by adding additives to increase the thermal conductivity.

Generally, the continuous structure of BN(C) may comprise between 5 and 80% carbon (by weight). This percentage depends on the applications to be considered. The carbon content may be modulated, in particular uniformly or locally, to vary the electrical properties, for example increasing the electrical conductivity over the entire structure or only in certain areas, typically in applications such as the electromagnetic protection of electronic components.

According to one embodiment, the continuous structure of BN(C) has a density between 1 and 5 mg/cm$^3$, and a porosity between 5 and 120 pores per inch.

The thermal conductivity of the continuous structure is generally higher than the thermal conductivity of the PCM.

As the continuous structure such as BN(C) foam is flexible, it may conform to the surface roughness of the electronic component and reduce the presence of air pockets, thus reducing the thermal contact resistance. It may also endure phase changes in PCMs, which generally have a phase expansion of 10 to 15%.

In addition, the continuous structure such as BN(C) foam, has the advantage of having an extremely low density, which makes it possible to maintain the storage capacity of the PCM at constant weight. BN(C) is a chemically inert material, thus making it possible to passivate/protect electronic components from the environment. This allows the compound to be used directly on the electronics and improves heat absorption.

PCM

PCM is understood to mean any material capable of effecting a phase transition at a given temperature (or restricted temperature range), and of storing and, possibly, transferring energy during this transition. During the phase transition, the temperature of the PCM remains constant. Generally, PCMs suitable for the invention involve a solid/solid or solid/liquid phase transition.

To ensure optimal thermal storage, PCMs typically have a latent heat density of fusion at least equal to 50 J/g.

According to one embodiment, PCMs may be chosen from PCMs of the polymer, organic, organometallic, inorganic or eutectic kind.

As PCMs, mention may be made, in particular, of PCMs chosen from among PCMs marketed by RUBITHERM, Polywax polyethylene (marketed by Baker Hughes), Puretemp (marketed by Puretemp), paraffin, erythritol, neopenthylglycol, or pentaerythritol.

The choice of PCM depends on the maximum authorized temperature for the application in question. Typically, a PCM is chosen where its phase transition temperature is less than or equal to the maximum authorized temperature.

The Composite Material

According to one embodiment, the composite material has a continuous structure of BN(C), a lower surface portion and an upper surface portion of BN(C) of which is each devoid of PCM, and whose internal area located between the two zones areas, is impregnated with PCM and is embedded in a polymer coating.

The composite material according to the invention is such that the PCM and the embedding polymer are incorporated into the interstices, such as the pores of said continuous structure of BN(C), such that, under each of the lower and upper faces, a non-zero thickness portion E1 and E2, respectively, is devoid of PCM. The material, therefore, has at least two layers under all or part of one of its faces devoid of PCM.

It should be understood that the material may also comprise portions devoid of PCM under one or more of its lateral faces.

The term "external face" is understood to mean an external surface of the composite material that is intended to be in contact with the element to be thermally regulated when the composite material is applied. It may be a lower, upper or lateral external face.

The "surface portion" or "portion" may correspond to all or part of the external face of the composite, it being understood that the portion comprises the part of the external face as well as the layer of thickness E located immediately under this part of the face. The continuous structure is devoid of PCM in this portion.

The composite material comprises at least two lower and upper surface portions (1'), of thickness E1 and E2, under all or part of the lower and upper faces, such that within said portions, the continuous structure of BN(C) is devoid of PCM. It should be understood that the thicknesses E1 and E2 may be identical or different.

As used here, the term "thickness E" refers to E1 and/or E2. Likewise, the term E' refers to E1' and/or E2', where appropriate.

The thicknesses E1 and E2 of said surface portions are substantially less than the thickness of the composite. Typically, the thicknesses E1 and E2 may be adapted as a function of the roughness of the material on which the composite material is to be applied. The portions are generally of a thickness at least equal to the diameter of a pore of the continuous structure. These thicknesses have to be sufficient to minimize the contact resistance and achieve the necessary thermal conduction. The thickness of the entire structure is generally limited due to the weight and space requirements of the electrical components. We may, for example, mention thicknesses E1 and E2 greater than 250 µm, in particular for a continuous structure of very high porosity.

The thicknesses E1 and E2 may be controlled by the process for manufacturing the composite material.

The thickness E' of the coating layer (10) is generally uniform over the entire coating layer.

Alternatively, the coating layer (10) may have different thicknesses E1' and E2', in particular on the lower and upper faces of the internal layer of PCM (5). Typically, E' (respectively E1' and E2') is less than the thicknesses E1 and E2. The thickness may be controlled by the coating layer manufacturing process.

The surface portions of the continuous structure of BN(C) devoid of PCM and of embedding polymer, therefore, only consist of the continuous structure of BN(C), which ensures good contact with the electronics and thus ensures good thermal conduction from the circuit to the composite, while controlling the electrical impact of the composite on the rest of the circuit.

Typically, therefore, the composite material according to the invention has, in particular, the following advantages:

very good conformability with the surface to be thermally controlled;
versatility: the phase change temperature may be modulated between 50 and 200° C., by modifying the PCM;
readily increased thermal storage capacity;
improved thermal conductivity compared to that of PCM (the increase related to the volume fraction in BN(C) may reach 10);
globally or spatially adaptable electrical insulation to avoid disturbing the electronic systems;
inert and chemically stable and does not emit gas under normal operating conditions, making it possible to avoid any reactions with the environment;
low density, making it possible to limit the weight of the system;
low thermal contact resistance, ensuring good absorption of heat of the electrical component.

According to another object, the present invention also relates to the method for the preparation of said composite material.

According to the invention, the method comprises:
i. the formation of an internal layer of PCM (5) within a continuous structure of BN(C) (1) comprising two lower and upper surface areas (1") of respective thickness E1" and E2" free of PCM;
ii. embedding of the layer of PCM (5) with a polymer coating layer (10) of thickness E'. This results in a composite according to the invention so that E1=E1"−E' and E2=E2"−E'.

The Formation of the Internal Layer of PCM (i)

The formation of an internal layer of PCM (5) within the continuous structure of BN(C) (1), may be carried out by applying the method described in application FR 17 00516.

In particular, this may be done by infusing the PCM in liquid form into a continuous structure of BN(C), with the exception of each surface portion (1") under the lower and upper external faces of said face of the continuous structure of BN(C) devoid of PCM.

These portions have the thickness E1" and E2", respectively.

According to a first embodiment, the formation of the internal layer (5) comprises the following steps:
The prior protection of each surface portion under the lower and upper external faces of the continuous structure of BN(C) over a thickness E1" and E2", respectively;
The impregnation of the continuous structure of BN(C) with a PCM in liquid form;
Selective deprotection of the protected surface portions (1");
from which results a continuous structure of BN(C) in which is incorporated an internal layer of PCM (5), with the exception of said surface portions (1") of thickness E1" and E2", devoid of PCM.

The protection may be effected by impregnating a protective material in the thickness of said surface portion.

This impregnation may be effected by any method that makes it possible to apply a liquid material to the surface and in the thickness of a matrix. The application method depends on the nature of the material and its viscosity, and of the matrix.

According to one embodiment, the impregnation may be carried out by hot infusion. The infusion may be effected by deposition or by soaking each surface portion of the continuous structure of BN(C) to be protected, on or in a solution of the protective material on the desired thickness of BN(C).

Generally, this impregnation may be carried out at a temperature above the melting temperature of the protective material, so that the latter is in liquid form with a viscosity adapted to the desired thickness.

The temperature of the protective material may be maintained at the desired level by keeping the bath of protective material on a hot plate.

The protective material is chosen in such a way that it may be:
- impregnated in the liquid state,
- maintained in the solid state during the impregnation of the PCM in the liquid state, and
- selectively deprotected from the composite formed.

Typically, the protective material is a polymer, optionally diluted in a solvent to adjust the viscosity of the protective material to the nature of the continuous structure of BN(C) and the desired thickness.

According to one embodiment, the protective material may be chosen, in particular, from polyethyleneoxide (PEO) with water or isopropanol (IPA) as solvent, polyvinylidene fluoride (PVDF) with dimethylacetamide (DMA), or N,N-dimethylformamide (DMF) as solvent, or neopentylglycol (NPG) with water as solvent.

According to one embodiment, PEO, diluted in water, may be used as a protective material with a dilution rate of between 10 and 50%, in particular between 20 and 25%.

PEO is a very common polymer and does not pose any particular problem in terms of handling and storage. Its solvent is water, which has the advantage of low cost and easy handling and storage.

According to another embodiment, the protective material may be NPG, which may be impregnated at approximately 130° C., and may be deprotected with concentrated ethanol or in dilute solution at a temperature between 50° C. and 70° C.

The protective material may be degassed before use, so as to remove air bubbles and thus allow better impregnation.

When the protection is effected using a protective material in the liquid state, the method comprises the intermediate step of fixing the protective material to the continuous structure by increasing the viscosity of the protective material, for example by evaporation of the solvent.

The protection step may be performed as many times as necessary as a function of the number of surface portions to be protected, before the PCM impregnation step.

The impregnation of the continuous structure of BN(C) by the PCM is then carried out with a liquid PCM, after protection of the surface portion(s) to be protected.

Conventionally, the impregnation step is carried out at a temperature higher than the melting temperature of the PCM.

Typically, the protective material must have either a melting temperature higher than the melting temperature of the PCM, or, if the protective material has a lower melting temperature, it must be subjected to a melting time when immersed in the liquid PCM, that is much higher at the time of infusion of the PCM in the unprotected continuous structure. In addition and typically, the protective material should not be attacked chemically by the PCM in liquid form.

If necessary, it is possible to cool the surface portions with the protective material locally during the impregnation of the PCM.

The PCM may be impregnated by dipping the entire protected continuous structure in a solution of PCM.

Generally, the method also comprises the intermediate step of fixing the PCM to the continuous structure by reducing the temperature to make the PCM change to the solid state prior to the deprotection step. This step may be carried out in molds of various shapes to allow adaptation to the packaging and the application.

The deprotection may be carried out, in particular, by selective degradation of the protective material, for example by chemical means, typically by the action of a deprotection solvent in which the protective material is soluble. This may be achieved by soaking the entire protected continuous structure in a bath of the solvent in question.

As the deprotection solvent, mention may be made of the solvents for the protective materials mentioned above.

In the case of NPG, this may typically be carried out in an ethanol bath at 60° C. allowing said surface portion to be obtained. The temperature of the bath may be adjusted in order to obtain a more or less rapid etching speed.

This alternative of the method according to the invention advantageously makes it possible to prepare a composite of the "sandwich" type, having portions of BN(C) devoid of PCM for two of its opposite faces, as described above according to a first embodiment.

According to a second embodiment, the method comprises the removal of the PCM impregnated in the structure of BN(C), within the surface portion(s).

Unlike the first method, this embodiment does not require a step for protecting said surface portion.

Thus, the method according to this second embodiment comprises the following steps:
- The impregnation of the continuous structure of BN(C) (1) with a PCM (5) in liquid form;
- Selective etching of the PCM within one or more surface portions.

As used herein, the term "etching" refers to chemical etching, which may be accomplished by immersion in an etching solvent bath. The etching solvent is a solvent which dissolves the PCM, but which does not damage the continuous structure of BN(C) during the etching.

We may thus cite ethanol, isopropanol (IPA), acetone, toluene, xylene, or vegetable oil as an etching solvent.

The temperature of the etching solution makes it possible to control the etching speed. In fact, the higher the temperature, the more rapid is the etching speed. The bath generally contains enough solvent to avoid saturation of the solvent with PCM, and thus avoid re-deposition of PCM.

The etching is typically carried out at a temperature below the boiling temperature of the bath, and also below the melting temperature of the PCM, to avoid liquefaction of the PCM.

Typically, in the case of using ethanol with a PCM having a melting temperature of 90° C., the etching temperature lies between 50° C. and 80° C. as a function of the desired etching speed.

Etching may be stopped by removing the composite from the etching bath.

After etching, a rinsing step may be effected, generally by soaking the composite in one or more ethanol baths at the same temperature as the etching bath.

Then drying may be effected, for example on a hot plate or in an oven at a temperature below the melting temperature of the PCM.

This alternative of the method of the invention advantageously makes it possible to prepare a composite having portions devoid of PCM on all sides.

According to a third embodiment, the method combines at least one protection step and at least one step of etching the PCM. This embodiment makes it possible to produce surface portions of different thicknesses.

The method then comprises the following steps:
- The prior protection of at least a surface portion (1') of the continuous structure of BN(C) (1) with a protective material having a different etching speed to that of PCM;
- The impregnation of the continuous structure of BN(C) (1) with a PCM (5) in liquid form;
- The etching of the PCM and of the protective material by immersion of the material in an etching solvent.

The etching anisotropy may be controlled using a protective material with an etching speed that is different from that of the PCM for the etching chemical bath used. For example, prior to the step of infusing the PCM into the continuous structure of BN(C), a surface portion of the continuous structure of BN(C) may be infused with a protective material, typically NPG in the liquid state at a temperature higher than the melting temperature of the PCM. After the NPG solidifies, the PCM may be infused in the liquid state at a temperature between the melting temperature of the PCM and that of the NPG. Then, the composite is etched by the etching solution. As the etching speed of the protective material is different from that of the PCM, this results in a surface portion devoid of PCM of different thickness depending on whether the portion had been impregnated with protective material or PCM. If necessary, the portion(s) still comprising protective material may be deprotected as explained above.

Advantageously, the etching solvent of the PCM also allows the deprotection/etching of the protective material.

For example, for an ethanol bath at 60° C., the etching of NPG is almost instantaneous, while that of PCM is of the order of 10 µm per minute. The entire area which has been infused by the NPG, and which may be several millimeters, is then released without the unprotected areas having been significantly engraved.

The material thus formed by this alternative method has a continuous BN(C) structure in which the PCM (5) is incorporated, with the exception of said surface portion (1') devoid of PCM, and of the other surfaces where the PCM has been engraved, wherein it should be understood that surface portions of different thicknesses may be produced, as a function of whether said portions have been protected or not.

This second alternative method according to the invention advantageously makes it possible to prepare a composite according to the second embodiment described above, having surface portions of BN(C) devoid of PCM under all of its lower, upper and lateral faces, thus delimiting an interior volume made up of BN(C) and PCM.

The method according to the invention may also previously comprise the preparation of the continuous structure of BN(C).

BN(C) foam may be prepared by applying or adapting the methodology described by Loeblein et al, Small, vol. 10, n. 15, 2992-2999, 2014.

Thus, the BN(C) foam may be prepared, in particular, by CVD growth (Chemical Vapor Deposition) on a metal skeleton based on copper or nickel, for example. After growth of the BN(C), the foam is coated with a polymer such as PMMA to ensure its stability, following which it is immersed in an acid bath to remove the metal skeleton. BN(C) foam is then obtained by removing the polymer or, alternatively, the PMMA may be at least partially retained to increase the solidity of the foam.

The composite material formed at the end of step (i) comprises, therefore, an internal layer of PCM (5) within a continuous structure of BN(C) (1) and two lower and upper surface portions (1") of thickness E1" and E2", respectively, under and on this layer of PCM.

Embedding (ii)

Typically, the embedding ii) may comprise the following steps:
- Partial protection of each surface portion (1") under each lower and upper face of a composite material obtained in step (i), over a thickness E1 and E2 that are less than E1" and E2" respectively, resulting in two superficial portions (1');
- The impregnation of the composite material thus protected on each of these two surface portions (1') by the coating polymer (10) in liquid form';
- Selective deprotection of the protected portions (1'); thus forming a continuous BN(C) structure, in which is incorporated an internal layer of PCM (5) embedded by a polymer (10) of thickness E', said internal embedded layer 5 being situated between two surface portions (1') of BN(C) devoid of PCM of thickness E1 and E2.

Thus, the composite material so formed comprises two lower and upper surface portions of respective thickness E1 and E2, such that E1=E1"−E1' and E2"=E2'−E2.

The thickness E' of the coating layer is, therefore, defined as the thickness of the portion of thickness E1" (respectively E2") not protected by the protective layer of thickness E1 (respectively E2).

It should be further understood that the thicknesses E1, E1", E2, E2" may be equal or different.

The protection may be carried out by impregnating a protective material over a partial thickness E1 and E2 in each of said surface portions (1") of the material obtained in step (i).

The protective material is impregnated over a thickness E1 and E2 of the portions (1") of BN(C), such that E1 and E2 are less than E1" and E2" respectively, thus defining two intermediate layers of BN(C) of unprotected thickness E' (E'1 and E2' respectively), which are respectively located between the inner layer of PCM and the protected upper and lower portions (1').

This impregnation and the choice of protective material may be carried out as discussed in paragraph (i) above.

After the protection of each of the surface portions (1'), the embedding polymer (10) is then impregnated in the portions (1') of unprotected BN(C) devoid of protective material and of PCM of thickness E'.

This may be achieved by soaking the entire protected continuous structure in a bath of the encapsulating polymer mixed with a solidifying agent in liquid form. This may be carried out advantageously at room temperature.

Vacuum degassing may be carried out before immersion and/or during immersion of the structure in the bath of the embedding polymer in order to avoid the presence of bubbles in the embedding polymer, during solidification.

The immersion may be effected in a mold of the size of the desired composite, or in any other suitable container.

After impregnation, the structure is removed from the bath and the polymer is generally solidified, for example by baking the structure or by UV exposure, in particular.

In the case of PDMS, this may generally be effected by annealing at about 80° C. in an oven, typically for one hour.

If necessary, the material may be trimmed by cutting the embedding polymer to remove the coatings external to the structure, in particular on the surface of the lower and/or upper faces and/or to size the coating layer on the lateral external faces to the desired thickness.

Thus, the polymer layer possibly formed on the lower and upper external faces has to be removed to reveal the lower and outer external faces impregnated with the protective material, in order to allow deprotection.

This cutting step is generally necessary when the impregnation into the polymer is not carried out in a sizing mold.

The deprotection may then be carried out, for example, by immersion of the entire structure in a bath of deprotection solvent that is selected according to the protective material used, by application or adaptation of the deprotection method discussed in paragraph (i) above.

The composite material thus formed may be applied, for example, to an electronic component.

The present invention therefore relates to a component to be thermally controlled comprising a composite according to the invention, in particular such that the composite is applied to the face that is devoid of PCM and is in contact with the component.

Generally, the choice of PCM is such that the melting temperature of the PCM is less than or equal to the maximum operating temperature of the component.

BN(C) foam has high thermal conductivity and is flexible/conformable. Upon being compressed, it fills all air holes and reduces thermal contact resistance. This improves the transmission of heat from the electronic component to the PCM. In addition, the continuity of the foam allows this heat to be diffused towards the PCM and then stored there. The variation of the quantity of carbon in the BN(C) foam in a global or localized manner, also makes it possible to make it compatible with the electronics to which it is applied. This allows the PCM to be positioned as close as possible to hot locations.

According to another object, the present invention also relates to the method of manufacturing an electronic component comprising a composite according to the invention This may be carried out by any accepted method, for example by compression of the composite, for example by embedding the composite in aluminum or a non-metallic encapsulant.

Figure 13:
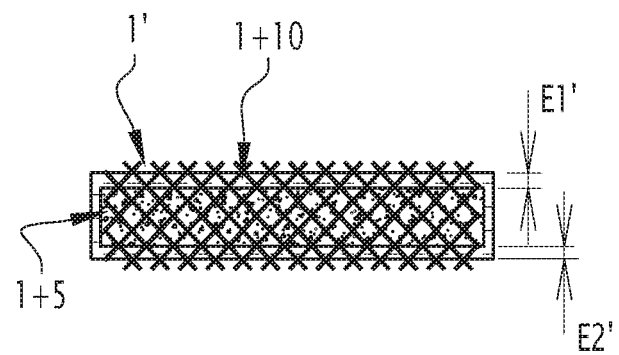
Figure 14:
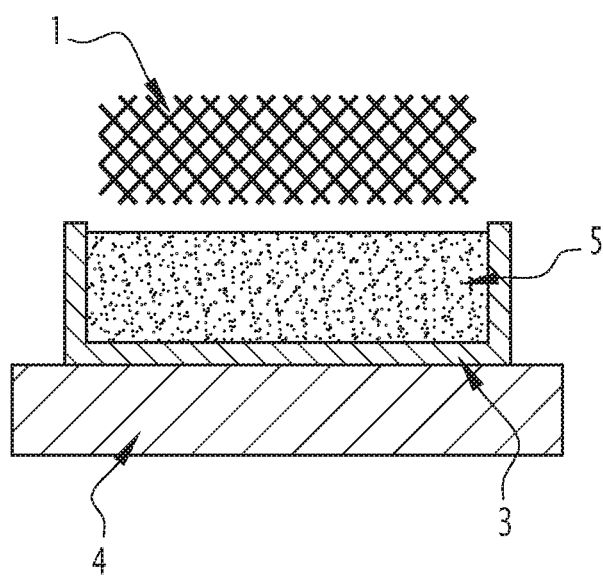
Figure 15:
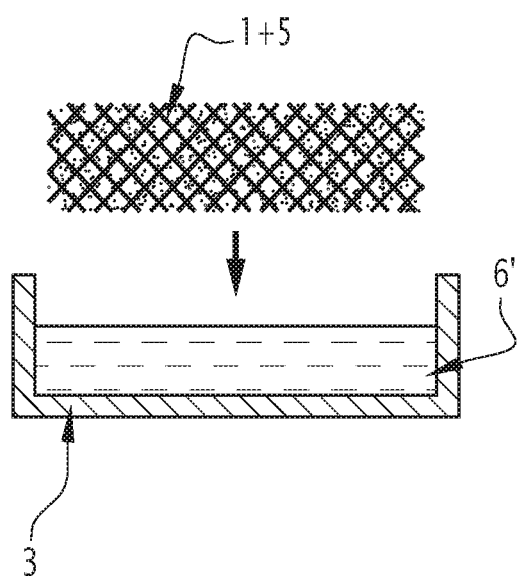
Figure 16:
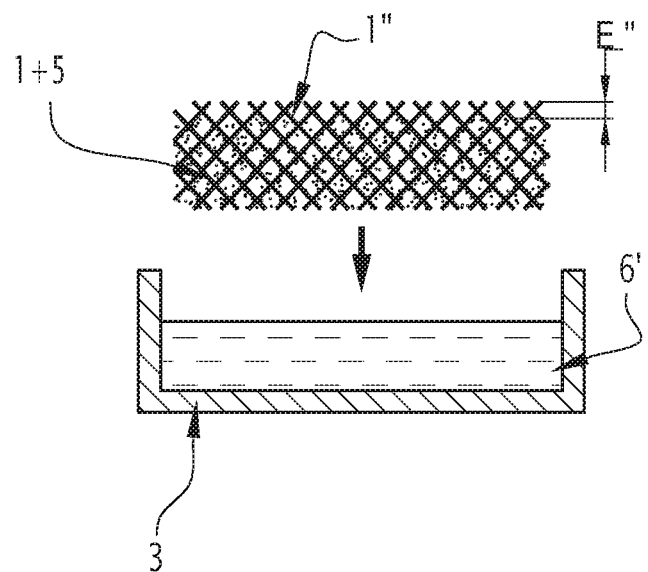
Figure 17:
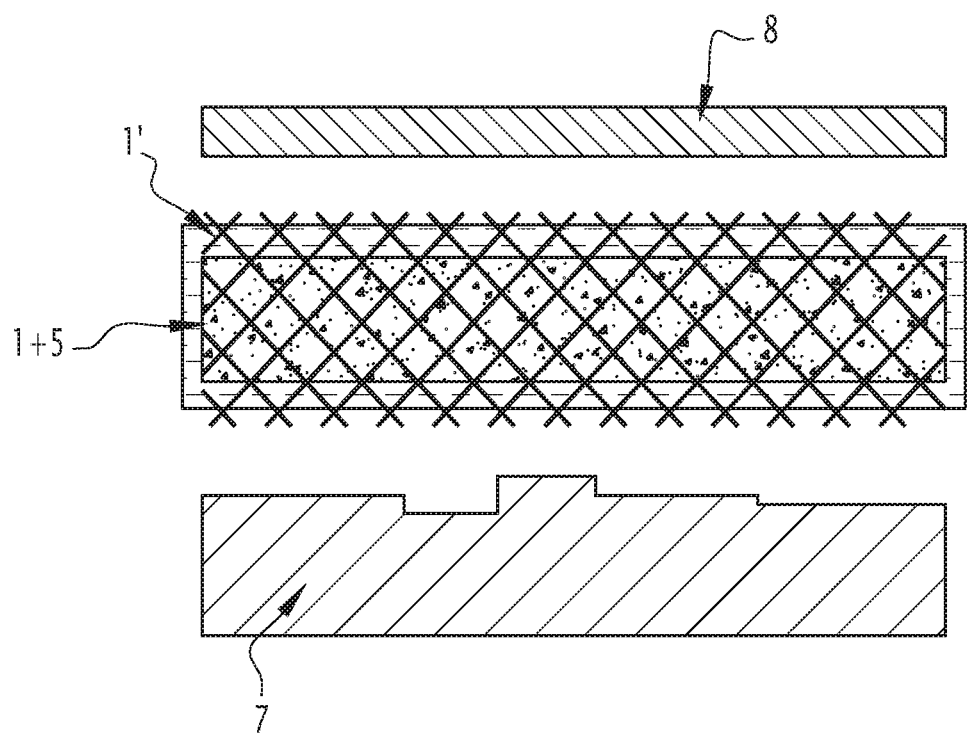
Figure 18:
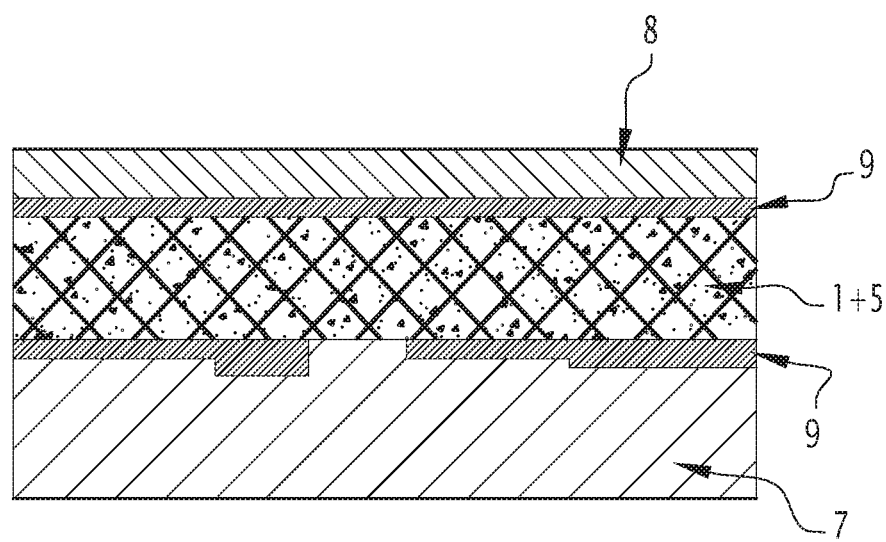

The invention and its advantages will be better understood upon studying the description which follows, given solely by way of example, and made with reference to the appended drawings, in which:

FIGS. 1 to 13 show illustrative diagrams of the steps of manufacturing a composite material according to the invention; while FIGS. 14 to 16 show diagrams illustrating the steps of manufacturing a composite material according to the invention, and relating it to the formation of the internal layer of PCM (5) within the continuous structure of BN(C) (1) devoid of PCM in the two upper and lower surface layers, according to the second embodiment;

FIGS. 17 and 18 show illustrative diagrams of the steps of manufacturing an electronic component comprising a composite material according to the invention.

Figure 2:
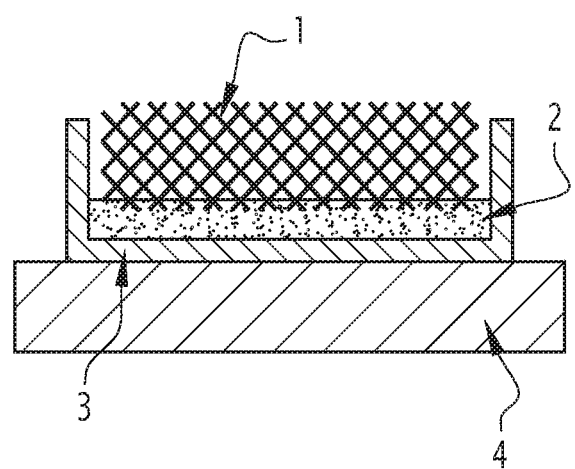
Figure 3:
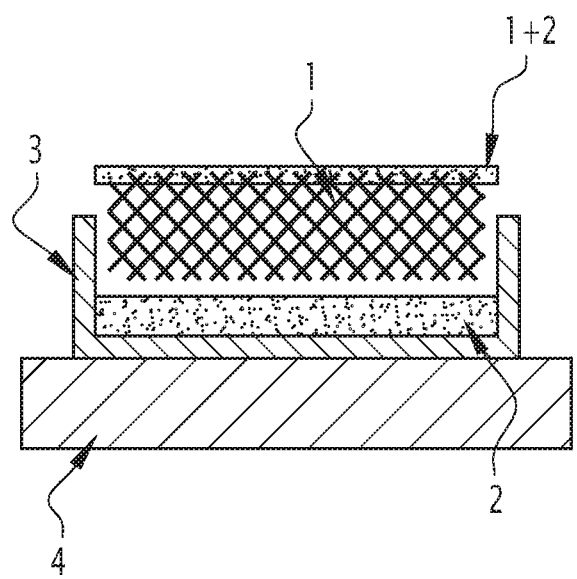

As illustrated in FIGS. 1 to 3, according to one embodiment, the composite material according to the invention may be prepared by forming an internal layer of PCM 5 within a continuous structure of BN(C) 1 as illustrated in FIGS. 1 to 6, followed by embedding the internal layer of PCM 5 that is shown schematically in FIGS. 7 to 13.

The manufacturing of the composite comprises the production of the BN(C) foam 1, followed by the protection of two lower and upper surface portions 1" of foam 1 with a protective material 2 (FIGS. 1 to 3), in order to avoid the presence of PCM 5 on the surface, followed by the infusion of PCM 5 in the foam 1 (FIG. 4), and, finally, the removal of the protection 2 (FIG. 5) to release the foam from the surface portions 1".

More specifically, as illustrated in FIGS. 1 and 2, a protective material 2 such as a polymer in solution in a solvent is prepared in order to obtain the desired viscosity (which influences the thicknesses E1" and E2" of the portions 1" of the foam impregnated with said material 2), and to limit the presence of bubbles during its solidification. In fact, the bubbles would make the material 2 fragile in places and allow penetration of the liquid PCM 5. This viscosity depends on the polymer as well as on its rate of dilution in a solvent.

Then, the protective material 2 is deposited in a container 3 (FIG. 1) and one of the lower or upper faces of the BN(C) foam 1 is deposited on said material 2 (FIG. 2). The whole is heated, for example, on a hot plate 4, until the material 2 forms a thin layer on the surface of the foam 1. The thickness of the protected surface portion 1" may be controlled thanks to the viscosity of the material 2.

Optionally, and as shown in FIG. 3, this operation may be performed in the same way on the other upper or lower face of the BN(C) foam.

Figure 4:
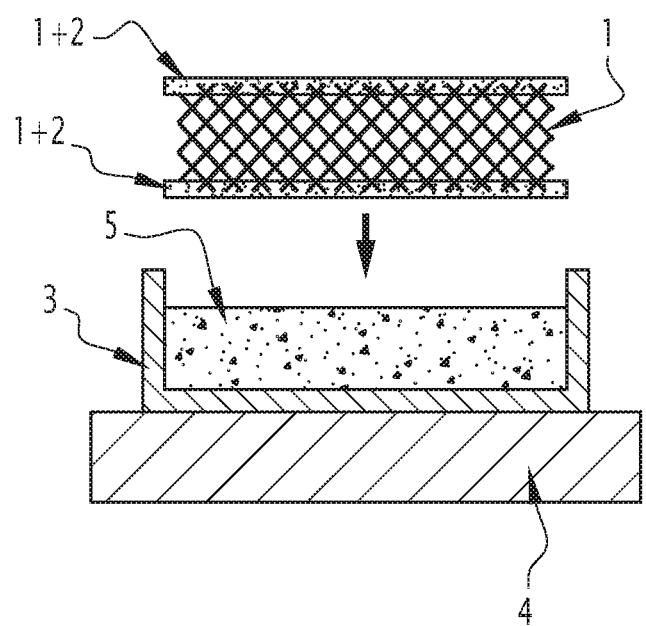
Figure 5:
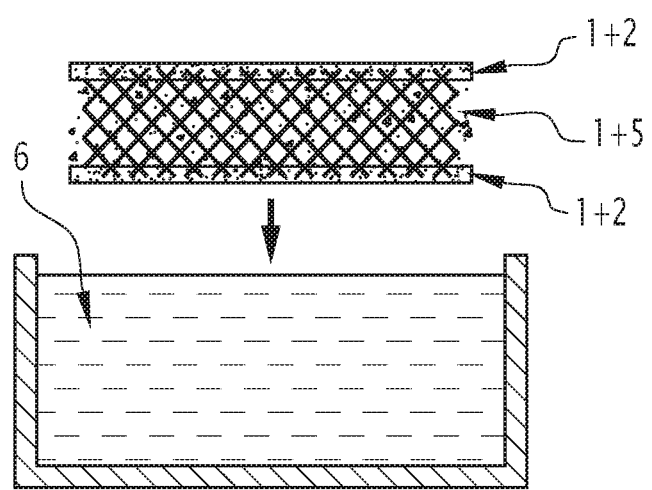

As illustrated in FIG. 4, once each side on which it is desired to preserve a surface portion 1" devoid of PCM, is protected, the PCM 5 is heated to change into the liquid state. The protected foam 1 is immersed in a bath of PCM 5. The PCM 5 is left so as to infuse only the core of foam 1, and then the whole is allowed to cool so that the PCM 5 changes to the solid state. The composite is then removed from the mold. The shape of the mold for PCM is arbitrarily chosen to be square on the diagrams, but the shape may be modified to adapt to the physical constraints of the packaging and the application.

Figure 6:
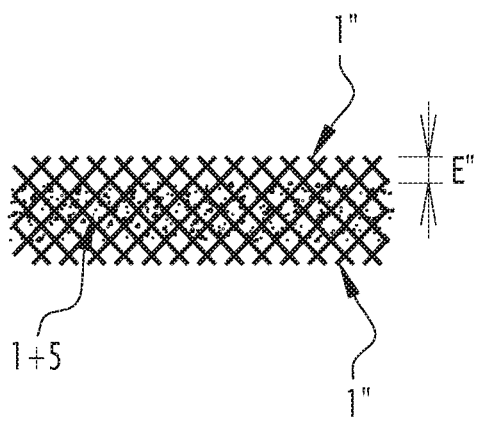

Finally, as illustrated in FIG. 6, the composite material is immersed in a solvent bath 6 of the protective material 2, so as to dissolve the material 2, thus freeing each surface portion 1" of thickness E1" and E2" of the material 2, wherein E1 "and E2" may be equal (i.e. E").

Figure 7:
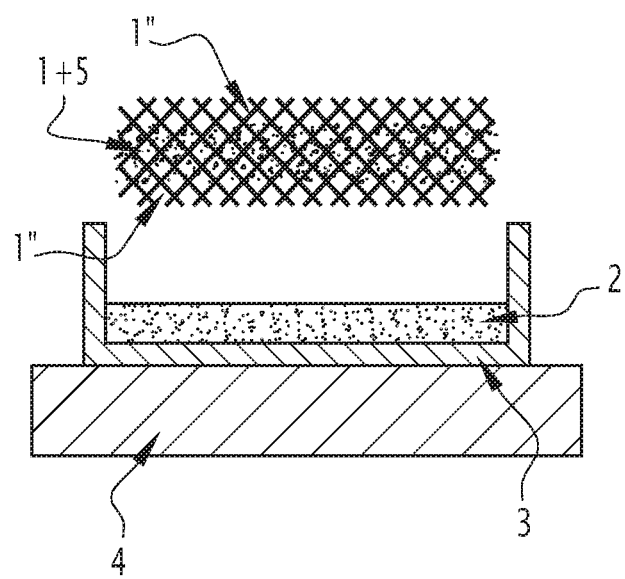
Figure 8:
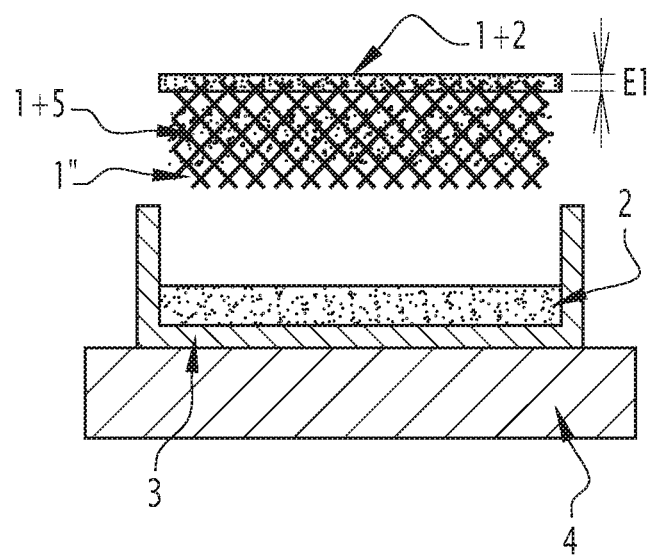
Figure 9:
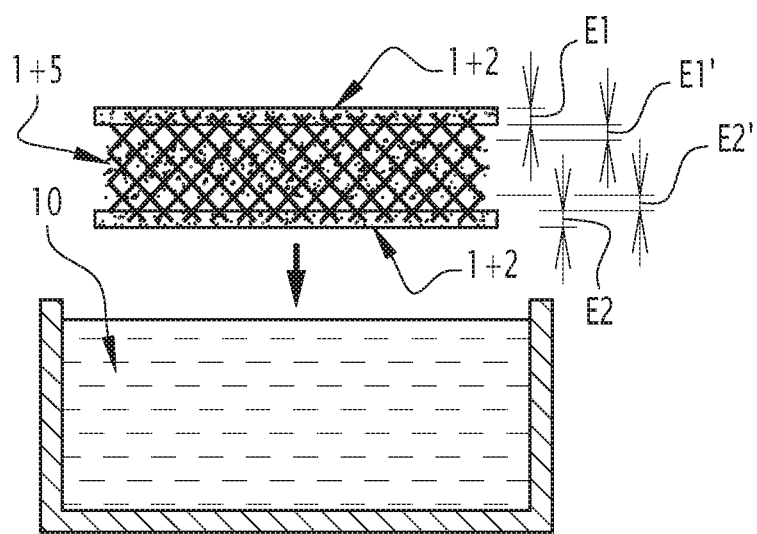

The embedding of the internal layer of PCM 1 is then carried out. The composite material obtained in FIG. 6 is immersed in a bath of protective material 2 maintained in liquid form on a hot plate 4 (FIG. 7). The composite material is immersed by a thickness E1 of the lower face, then it is removed from the bath and turned over and immersed by a height E2 of the upper face of the composite material (FIG. 8). After removal, a composite material is thus obtained consisting of a continuous structure of PCM, comprising an internal layer of PCM 5, as well as two lower and upper external portions of BN(C) impregnated with protective material 2, over a respective thickness E1 and E2. On either side of the internal layer 5, are located two layers of BN(C) devoid of PCM and protective material of respective thickness E1 'and E2', it being understood that E1' and E2' may be equal (i.e. E'). The composite material thus protected is then impregnated with the embedding polymer: this is achieved by immersing the complete structure in a bath of said polymer 10 (FIG. 9). The liquid embedding polymer, therefore, infuses inside the structure of free BN(C), in the thicknesses E1' and E2' mentioned above.

Figure 10:
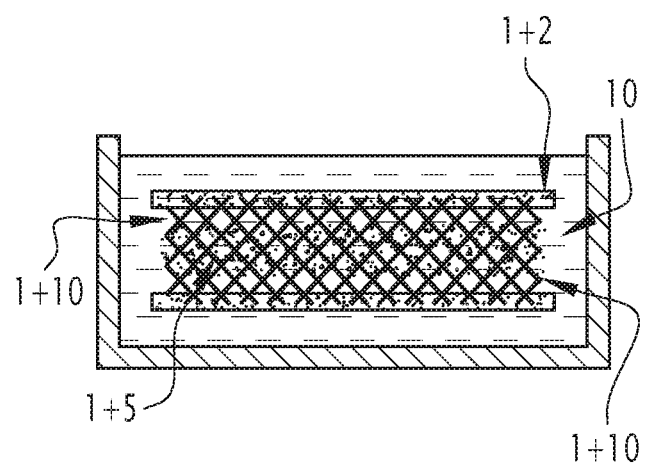
Figure 11:
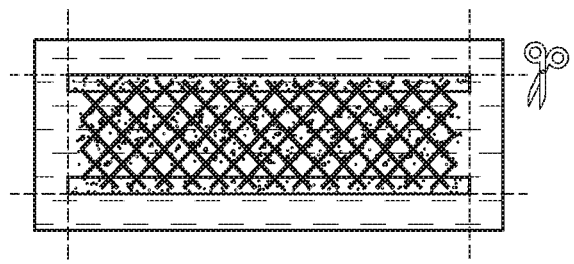
Figure 12:
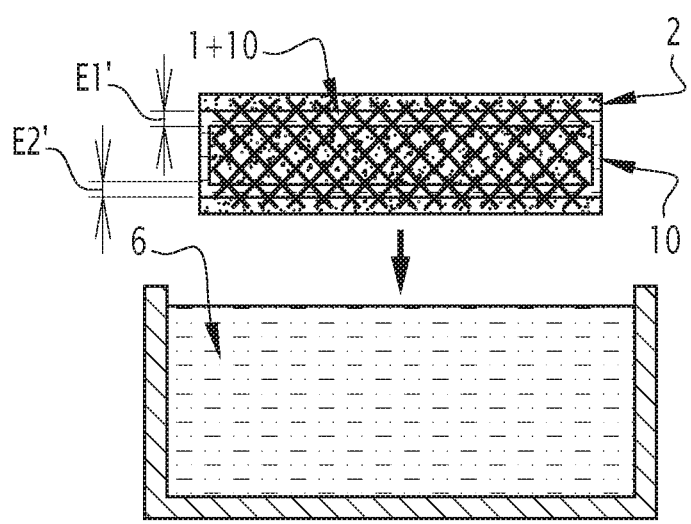

Then the polymer is solidified, for example by placing the bath and composite assembly, in an oven (FIG. 10). At the end of the solidification, the composite material is then generally surrounded on all of the external surfaces with a layer of embedding polymer, in particular when the size of the mold is greater than the size of the composite. It is, therefore, generally recommended to cut the outer embedding layer which may exist on the lower and upper external surfaces, in order to release the protected surface portions 1" (FIG. 11).

On the lateral surfaces, the polymer layer must be retained on each of the lateral faces of PCM, so as to embed the entire volume of PCM. FIG. 10 represents the solidification of the embedding polymer within a container of a size that is substantially greater than the composite material. Optionally, it is also possible to perform this step in a mold corresponding to the size of the composite material, so as to avoid solidification of the unnecessary embedding polymer, in particular on the lower and upper external faces.

The composites for which the lower and upper external faces have been exposed, may then be deprotected (FIG. 12) by immersing the material in a solvent bath of the protective material 6.

After removal from the bath 6, a composite material is obtained comprising surface portions 1' of BN(C) devoid of protective material and of polymer of thickness E1 and E2 respectively, an internal layer of PCM 5, embedded within a polymer coating layer 10 of thickness E' (FIG. 13).

Alternatively, the component obtained in FIG. 6 may be produced according to the second or third embodiment according to the invention.

As illustrated in FIGS. 14 to 16 according to the second embodiment of the method according to the invention, the composite material according to the invention may be prepared by intermediate preparation of the internal layer (5) of the selective etching of PCM.

The manufacture of the composite firstly involves immersing the continuous structure of BN(C) in a bath of PCM 5 contained in a container 3 placed on a hot plate 4. The immersion is carried out entirely according to the second embodiment (FIG. 14). Then the material is removed from the bath: it then consists of the structure of BN(C) impregnated over its entire thickness with PCM 5. The surface portions of the material thus obtained are then soaked in a bath of an etching solution 6', allowing the PCM to dissolve on the immersed portions of thickness E" (FIGS. 15 and 16). The lower and upper faces may thus be successively immersed, to release two lower and upper BN(C) surface portions 1" devoid of PCM. According to a variant of this embodiment, the material may be completely submerged, resulting in all the surface portions being released from PCM under all the faces of the material.

A third embodiment may be represented by combining the steps of FIGS. 1-5 and 14-16.

The composite material thus formed may then be applied to a component to be thermally controlled, for example an electronic component.

According to a variant shown in FIG. 17, the composite material may be embedded between an aluminum cover 8 and an electronic component 7, such as, for example, a processor.

Component 7 has an irregular relief on its surface. By compression, the surface portions 1' of the composite material fill the cavities and match the roughness of the component 7.

Thus, as illustrated in FIG. 18, the compressed surface portions 1' form layers 9 of BN(C), which are in contact with the component 7, on the one hand, and the cover 8, on the other hand. This provides electrical insulation, passivation of the component, and reduction of thermal contact resistance.

The following examples illustrate the present invention without limitation.

EXAMPLE 1: PREPARATION OF BN(C) FOAM

BN foam was prepared by applying the methodology described by Loeblein et al, Small, vol. 10, n. 15, 2992-2999, 2014, without performing the carbon growth step. PMMA is deposited just before the etching of the nickel in order to mechanically reinforce the BN. PMMA may be removed or stored after etching the nickel.

EXAMPLE 2: PREPARATION OF THE COMPOSITE

Strategy

In order to make BN(C) foam infused with PCM (Phase Change Material) only at its center and not at the surface, the first strategy is to use a material that will protect the surfaces of the foam during infusion. This protective material will then be removed.

Protection of the Foam Faces

PEO (polyethylene oxide) was used as a protective material. First, it is diluted in water in proportions that allow a polymer to be obtained with an adequate viscosity, in this case between 20 and 25% PEO.

In the second step, the diluted polymer is stored under vacuum at approximately 2.5 mTorr for 30 min. The purpose of this "degassing" step is to remove the air bubbles that were trapped in the polymer during mixing. Without this step, then, during the densification phase, air bubbles could form, damage the foam, and compromise the uniformity of the thickness of the polymer.

Third step: the polymer is deposited in an aluminum mold. The quantity of polymer will depend on the dimensions of the mold and in order to have a thickness of polymer of approximately 3 mm. Then the foam is deposited on the polymer which will slightly penetrate it. The depth of penetration will depend on the viscosity of the polymer. Finally, the mold is placed on a hot plate in order to gradually densify the polymer by evaporating the solvent (in this case, water). It has been experimentally shown that a step of 80° C. for 40 min and then an increase of 5° C. every 5 min to reach 120° C. is favorable. However, these temperatures and times depend on the temperature sensor of the hot plate as well as on the environment of the laboratory because everything is done in air.

Fourth step: the foam with a protected face is removed from the mold. One of the faces is punctured with a needle. These perforations are intended to help infuse PCM afterwards while doing very little harm to the foam.

The fifth step is identical to the third step but on the opposing face of the foam.

PCM Infusion in the Protected Foam

Paraffin was used as the PCM.

The paraffin is heated to 110° C. in the aluminum mold, i.e. slightly above the melting temperature of 90° C. of the paraffin. Once the paraffin is in the liquid phase, the foam with the two protected faces is immersed: the paraffin infiltrates on the sides but also via the perforated face which is kept above. The foam remains between 3 and 5 min in the PCM to ensure that the infusion is complete, while avoiding the melting of the protective polymer. Finally it is set to cool naturally or in a fridge to speed up the cooling.

Removal of the Protective Polymer

To remove the polymer, the protected foam is immersed in water at room temperature. The compound is kept upright (to avoid damaging the surfaces) in a beaker of water overnight. The water bath is renewed and left to act for an additional night to improve deprotection as a function of the thickness of the polymer, the size of the sample, and the amount of water. Finally, the sample is allowed to dry.

EXAMPLE 3: CHARACTERIZATIONS/PERFORMANCE OF THE COMPOSITE

Thermal Characterizations:
Measurement of the density of the final compound. In order to show that the foam only slightly modifies the weight of the PCM alone.
Measurement of the latent heat of fusion of the compound. This is for the same reason, i.e. to show the low impact of foam on the thermal storage capacity of PCM. Effectively, we want to conserve the latent fusion heat of the PCM.
Measurement of thermal conductivity to show the contribution and interest of the foam.
Contact resistance measurement to check the ability of the compound to conform to surfaces.
Electrical Characterizations
Evaluate the electrical conductivity of the compound to confirm its insulating aspect for pure BN(C), and slightly conductive for BN(C)C. Likewise for the validation of insulating or slightly conductive areas in the case of localized doping.
Radiofrequency measurements (losses, transmissions) to learn the impact of the presence of the compound in an electronic environment.
Physical Characterizations
Coefficient of thermal expansion of the compound for the future design of the packaging.
Mechanical resistance in compression and tension
Visualization of the conformability of the foam released on the surface.

EXAMPLE 4: PREPARATION OF THE COMPOSITE WITH PROTECTIVE MATERIAL, AND BY ETCHING, INCLUDING PERFORMING A PDMS EMBEDDING

In order to avoid leakage of the PCM during its melting phase, this method proposes to include a packaging material.

The continuous structure of BN(C) is first partially infused to a thickness of about 5 mm with NPG in liquid phase at 130° C., Figure a) and b). The method may be repeated on the opposite face of Figure c). Once the NPG has cooled and solidified, the PCM is infused into the free part of the continuous structure. The infusion is made at 120° C. on a hot plate or in an oven, Figure d). The compound so obtained is then immersed in an etching solution, rapid for the NPG and slow for the PCM, typically ethanol at 60° C., Figure e). The NPG is then dissolved almost instantly while the PCM is etched slowly. The compound with a 5 mm surface portion is removed from the etching solution, then a phase of protection of part of the surface portion is repeated according to the surface protection technique described previously. However, the protection is carried out so as to keep part of the non-infused surface portion between the protection and the PCM, Figures f), g) and h).

The next step is to prepare the packaging material, typically PDMS, mixing it with a solidifying agent with a ratio of 10:1, and placing it under vacuum for 1 hour for degassing. Once the PDMS is ready, it is placed in a mold in which the compound is immersed, Figure h). The whole is placed under vacuum for 1 hour to remove any bubbles from the immersion step, then the whole is placed in an oven at 80° C. for solidification of the PDMS for 1 hour, Figure i).

After the PDMS has solidified, it is cut on the surface so that only the protective material appears; the solid NPG is shown in Figure j).

Finally, the NPG is removed by immersing the assembly into an ethanol bath at 60° C. for a few minutes in order to dissolve the NPG, Figure k). This results in a PCM sealed by PDMS with a continuous structure passing through the whole of the compound in FIG. 1), thus ensuring thermal conduction and reduction of thermal contact resistance.

Optionally, it is possible in the method to have a longer etching step during the step of Figure e), to give a surface portion on the other faces of the compound Figure m). The rest of the method is identical to Figure n). This allows the presence of the continuous structure in the PDMS Figure p). In fact, the presence of the continuous structure in the PDMS makes it possible to increase its thermal conductivity, and, therefore, to make it more conductive of heat.

The implementation of this option enables us to have a thermally insulating or conductive packaging, that is also electrically insulating or conductive, as a function of the type of continuous structure used.

EXAMPLE 5: MANUFACTURE OF A COMPONENT COMPRISING THE COMPOSITE

The invention may be applied in the case of a power transistor, dissipating, for example, 20 W, during cyclic use, for example for continuous operation of less than 15 min, followed by 15 min of cooling. The PCM is chosen as a function of the maximum critical temperature of the transistor: the melting temperature of the PCM must be equal to or lower than that of the critical temperature of the transistor. The material according to the invention is applied directly to the transistor, with one of the stripped faces of the PCM in contact with the transistor to ensure good thermal contact. Embedding is performed around the PCM as well as at the base of the processor to ensure sealing.

The invention claimed is:

1. Composite material comprising:
    boron nitride (BN(C)) in the form of a porous material consisting of BN optionally doped with carbon (BNC) of continuous 3D structure, not dispersed;
    an internal layer of a Phase Change Material (PCM) incorporated within said continuous structure of BN(C), and
    a surface portion of BN(C) devoid of PCM, under each of the upper and lower external faces of the composite material, with thickness E1 and E2,
    said material being characterized in that:
    the layer of PCM is embedded by a coating layer of polymer of thickness E', and said surface portions devoid of PCM, are each located on either side of the internal layer of embedded PCM.

2. Composite material according to claim 1, such that said polymer is polydimethylsiloxane (PDMS).

3. Composite material according to claim 1, such that the continuous structure of BN(C) is a foam of BN(C).

4. Composite material according to claim 1, such that the continuous structure of BN(C) is a continuous foam of BNC.

5. Method for preparing the composite material according to claim 1, said method comprising:
    i. the formation of an internal layer of PCM within the continuous structure of BN(C) by a strategy of protection/deprotection of the surface layers or by a strategy of selective etching of PCM; and
    ii. embedding of the PCM layer with a polymer coating layer.

6. Method according to claim 5, such that the formation of the internal layer by protection/deprotection comprises the following steps:
- the prior protection of each surface portion under the lower and upper external faces of the continuous structure of BN(C) over a thickness E1" and E2", respectively;
- the impregnation of the continuous structure of BN(C) with a PCM in liquid form; and
- selective deprotection of the protected surface portions from which results a continuous structure of BN(C) in which is incorporated an internal layer of PCM, with the exception of said surface portions of thickness E1" and E2", stripped of PCM.

7. Method according to claim 5 by selective etching of the PCM comprising the following steps:
- the impregnation of the continuous structure of BN(C) with a PCM in liquid form; and
- selective etching of the PCM within at least one surface portion.

8. Method according to claim 5 comprising:
- the prior protection of at least a surface portion of the continuous structure of BN(C) with a protective material having a different etching speed than that of PCM;
- the impregnation of the continuous structure of BN(C) with a PCM in liquid form; and
- the etching of the PCM by immersion of the impregnated surface area (s) of the material in an etching solvent.

9. Method according to claim 5 wherein the embedding ii) comprises the following steps:
- partial protection of each surface portion under each lower and upper face of a composite material obtained in step (i), over a thickness E1 and E2 that are respectively less than E1" and E2", resulting in two superficial portions;
- the impregnation of the composite material thus protected on each of these two surface portions by the coating polymer in liquid form; and
- selective deprotection of the protected portions;
- thus forming a continuous BN structure (C) in which is incorporated an internal layer of PCM embedded by a polymer of thickness E', said internal embedded layer being situated between two surface portions of BN(C) devoid of PCM of thickness E1 and E2.

10. Electronic component comprising a composite material according to claim 1.

11. Method for manufacturing the component according to claim 10 comprising the step of applying the composite to a component.

* * * * *